US007446683B2

(12) United States Patent
Perner

(10) Patent No.: US 7,446,683 B2
(45) Date of Patent: Nov. 4, 2008

(54) DIGITAL CURRENT SOURCE

(75) Inventor: Frederick A. Perner, Santa Barbara, CA (US)

(73) Assignee: Samsung Electronics Co., Ltd. (KR)

( * ) Notice: Subject to any disclaimer, the term of this patent is extended or adjusted under 35 U.S.C. 154(b) by 460 days.

(21) Appl. No.: 11/267,705

(22) Filed: Nov. 3, 2005

(65) Prior Publication Data

US 2007/0096713 A1 May 3, 2007

(51) Int. Cl.
*H03M 1/00* (2006.01)

(52) U.S. Cl. ....................... 341/135; 341/133; 341/144; 341/145; 341/153

(58) Field of Classification Search ......... 341/133-136, 341/144-154
See application file for complete search history.

(56) References Cited

U.S. PATENT DOCUMENTS 5,283,579 A * 2/1994 Tasdighi et al. ............. 341/145
5,548,288 A * 8/1996 Lueng ........................ 341/136
6,246,351 B1 * 6/2001 Yilmaz ....................... 341/145
6,583,744 B2 * 6/2003 Bright ........................ 341/145
6,664,909 B1 * 12/2003 Hyde et al. ................. 341/144
6,703,956 B1 * 3/2004 Mueller et al. .............. 341/145
6,833,801 B1 * 12/2004 Ostrem et al. ............... 341/144
6,927,719 B1 * 8/2005 Siniscalchi .................. 341/144
7,030,799 B2 * 4/2006 Lee et al. .................... 341/144
7,227,483 B2 * 6/2007 Seo ............................ 341/144
7,369,076 B1 * 5/2008 Chung et al. ................ 341/144
2002/0063644 A1 * 5/2002 Clara et al. ................. 341/136

* cited by examiner

*Primary Examiner*—Linh V Nguyen
(74) *Attorney, Agent, or Firm*—Myers Bigel Sibley & Sajovec

(57) ABSTRACT

A digital current source used to mirror a reference current is provided. The digitally controlled analog current source multiplies a current from a master mirror transistor producing an output current that is a digitally controlled multiple of the reference current. The circuit comprises a plurality of one bit current mirror cells. Each one bit current mirror cell comprises a mirror transistor receiving an analog gate voltage from a master mirror transistor and providing a drain voltage, an operational amplifier configured to maintain the drain voltage for the mirror transistor equivalent to the analog gate voltage, and a switch configured to receive one control bit, the switch enabling current mirroring when the mirror voltage is substantially equivalent to the master mirror voltage. The digital current source further includes a common line summing element employed to receive and compile currents from each of the one bit current mirror cells.

24 Claims, 3 Drawing Sheets

DIGITAL CURRENT SOURCE

BACKGROUND OF THE INVENTION

1. Field of the Invention

The present invention relates generally to the electrical circuitry, and more particularly to digital to analog current generator (IDAC).

2. Description of the Related Art

Current generators historically have employed two different types of electrical circuit designs. The first is a simple current mirror circuit such as that shown in FIG. 1, where transistor 101 has a reference current constantly flowing therethrough. Resistor 104 is provided to set the reference current, and resistor 105 conducts an output current equal to the reference current provided the two transistors 101 and 102 are matched. Voltage source 103 is sufficient to provide a reference gate to source voltage at the gate of transistor 101 and is sufficient to maintain the reference current through the drain of transistor 101. Transistor 102 mirrors the reference current in the right branch of the circuit as shown so that the drain current in transistor 102 is the same as that of the left branch. With similar or identical transistor sizes and a single voltage 103, the resultant current in both right and left branches is identical. However, as a result of the design shown in FIG. 1, drain to source voltage variations across the transistors 101 and 102 can vary widely and produce uncontrolled and unpredictable variations in the resultant output current flowing in the drain of transistor 102. Certain applications, such as MRAM (Magnetic Random Access Memory), cannot employ a current mirror such as the current mirror shown in FIG. 1 due to the resultant wide variations in output current.

Another solution employed for current generator circuit uses a feedback amplifier. FIG. 2 illustrates a design using a feedback amplifier. From FIG. 2, reference voltage source 201 is provided with resistor 202, feedback amplifier 203, and current source transistor 204. In this design, a reference voltage is placed outside the feedback loop and is selected to establish a desired output current through the load resistor 202. Output current at the source of transistor 204 corresponds to the current passing through resistor 202. The feedback amplifier 203 continually adjusts the gate to source voltage of transistor 204 to minimize the effect of gate to drain voltage variations in transistor 204 and thereby maintain a desired output current in load resistor 202.

Control of the current in the design of FIG. 2 depends directly on the absolute value of resistor 205 and reference voltage source 201. While the value of the reference voltage source 201 may be precisely controlled with a DAC (digital to analog voltage converter) the magnitude of the output resistor 205 may not be known or well controlled and can again produce uncontrolled and unpredictable variations in the resultant output current. Certain applications such as MRAM cannot employ a current generator such as the current generator shown in FIG. 2 due to the resultant wide variations in output current.

It would be advantageous to provide a precision current generator that can be used in advanced applications, such as MRAM applications, where the output current is precisely controlled and thus decreases the risk of producing uncontrolled or unpredictable variations in output current, thereby resulting in lower circuit currents, efficient use of power, and generally improved performance.

SUMMARY OF THE INVENTION

According to a first aspect of the present design, there is provided a digital current source used to mirror a reference current using a digitally controlled analog current source. The digitally controlled analog current source multiplies a current from a master mirror transistor producing an output current that is a digitally controlled multiple of the reference current. The circuit comprises a plurality of one bit current mirror cells. Each one bit current mirror cell comprises a mirror transistor receiving an analog gate voltage from a master mirror transistor and providing a drain voltage, an operational amplifier configured to maintain the drain voltage for the mirror transistor equivalent to the analog gate voltage, and a switch configured to receive one control bit, the switch enabling current mirroring when the mirror voltage is substantially equivalent to the master mirror voltage. The digital current source further includes a common line summing element employed to receive and compile currents from each of the one bit current mirror cells.

According to a second aspect of the present design, there is provided a single bit precision current mirror cell. The single bit precision current mirror cell is configured to receive a master transistor voltage and a digital control value. The single bit current mirror cell includes a transistor configured to receive the master transistor voltage and provide a mirror gate voltage and an operational amplifier configured to receive the master transistor voltage and mirror gate voltage and maintain the master transistor voltage substantially equivalent to the mirror gate voltage using feedback. The single bit precision current mirror cell further receives the digital control value and employs the operational amplifier to and provide an analog cell current output substantially mirroring a digital derivative of a reference current value.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present invention is a set of one bit precision current mirror cells or current source blocks employing feedback amplifiers and switching components. The present design may employ CMOS circuits, offering both low voltage and high voltage transistors. The present design thus includes a plurality of switched precision current sources, or current circuits, controlled by a digital control word to form a digital to analog controlled current source. The present design uses a master and slave voltage arrangement between a reference voltage and all of the switched precision current sources.

Figure 1:
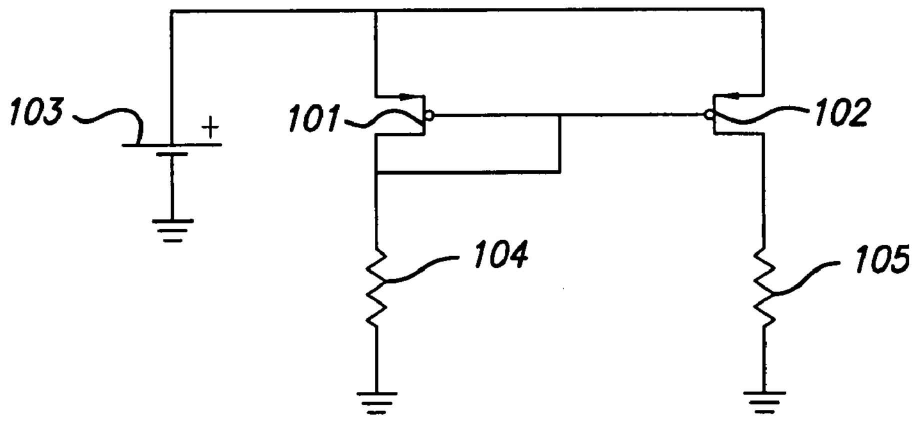
FIG. 1 illustrates a simple prior art current mirror that can exhibit wide variations in output current.
Figure 2:
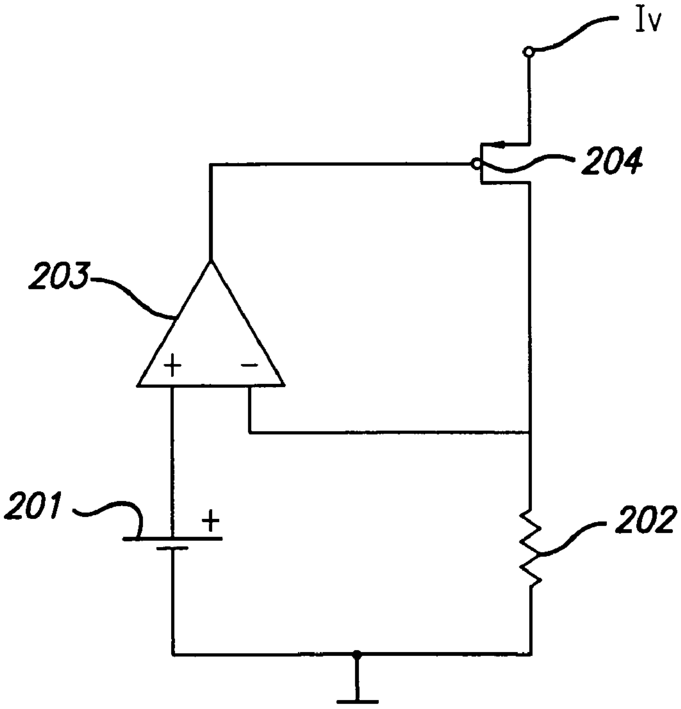
FIG. 2 is a prior art switched current mirror circuit using a feedback amplifier that may result in high circuit currents and wasted power.
Figure 3:
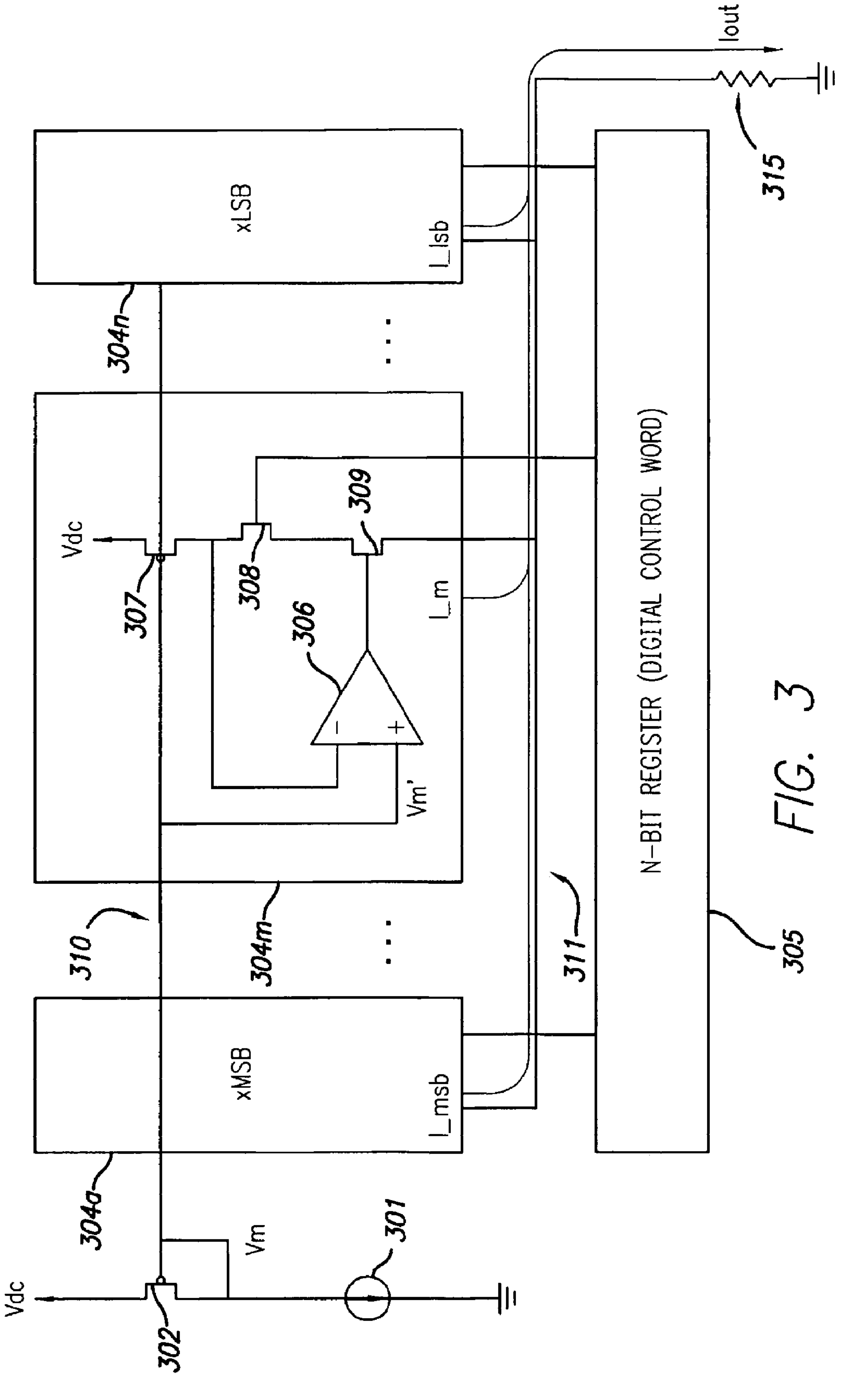
FIG. 3 illustrates one embodiment of the present design using multiple one bit precision current mirror cells appropriate for use in certain advanced applications, such as MRAM applications.

FIG. 3 illustrates one embodiment of the device. From FIG. 3, reference current generator 301 provides current to master mirror transistor 302 and line 303, where line 303 forms the mirror gate voltage Vm. As shown in FIG. 3, line 310 connects to multiple one bit precision current mirrors 304*a*-N, where three such representative one bit current mirrors are illustrated in FIG. 3. Output from each one bit current mirror flows to an N-bit register 305, forming a digital control word. The leftmost one bit precision current mirror cell labeled 304*a* is the most significant bit (MSB) one bit precision current mirror cell, and the rightmost one bit precision current mirror cell labeled 304N is the least significant bit (LSB) one bit precision current mirror cell for the digital control word formed in the N-bit register 305. While not expressly shown in this view, both the MSB one bit precision current mirror cell 304*a* and the LSB one bit precision current mirror cell 304N have a construction as shown in the $m^{th}$-bit one bit precision current mirror cell 304*m*.

The $m^{th}$-bit one bit precision current mirror cell 304m comprises feedback amplifier 306, where the positive gate is connected to the line 310 from master mirror transistor 302. Binary weighted mirror transistor 307 receives signal from line 310 and produces Vm', a voltage similar to but possibly not identical to voltage Vm produced at the master mirror transistor 302. Vm', called the drain voltage, is received at the negative gate of feedback amplifier 306. Select switch 308 also known as a switch transistor or simply switch, may receive bit m from N-bit register 305 when bit m is selected or forms part of the control word. Analog control transistor 309 receives gate control from feedback amplifier 306 and controls the drain voltage of transistor 307 to be as close as possible to the voltage Vm on line 310. Controlling the gate-to-drain voltage on transistor 307 to be approximately equal to zero to cause the terminal voltages on the mirror transistor 307 to be substantially identical to the terminal voltages on the master mirror transistor 302 for accurate current mirror operation.

The drain current from transistor 307 flows into output line 311 and combines the output with other output currents. Vdc voltage is a power supply common to both the source of the master mirror transistor 302 and each mirror transistor 307 in each one bit current mirror cell. In other words, the gate-to-source control voltage Vm out of master mirror transistor 302 is passed to each one bit current mirror cell in the current mirror arrangement and controls the drain current when the one bit current mirror cell is selected using the control word from N-bit register 305. In the arrangement shown, resistor 315 receives lout as the sum of the currents from the selected one bit current mirror cells.

The purpose of the one bit current mirror cell arrangement shown in the embodiment of FIG. 3 is to provide a digitally controlled output current from the configuration on the left side of FIG. 3, namely reference current generator 301 passed to master mirror transistor 302, into a digital range of currents from least significant to a most significant bit in an expected range of currents. Supply voltage is provided in the form of Vdc, which is applied to the master mirror transistor 302 and is passed to each of the one bit current mirror cells 304*a*-N. Bit mirroring of current in this arrangement comprises binary weighting, where each one bit current cell may be scaled by powers of two to correspond with the binary value stored in the N-bit register 301. Alternately, the one bit current cells may be linearly weighted, where each one bit current cell may be summed according to the binary value stored in the N-bit register 301.

For example, if the arrangement provides four bits, those bits may be represented by multiples of 8, 4, 2, and 1. If the expected current range is 0 microamps to 1.5 milliamps, this 1.5 milliamp range may be divided into 15 steps (8+4+2+1) of 100 microamps apiece. The reference current is set at 100 microamps and the relative size of the mirror transistors in the one-bit current mirror cells 304 (1 through 4) will be 1×, 2×, 4×, and 8× multiples of the master mirror transistor 302. Thus in operation, if the desired output current is 300 microamps, binary control of 0011 is needed. The N-bit register 305 provides a control word of 0011, and thus triggers the select switch for the third and fourth one bit precision current mirror cell. Thus, in this example the four one bit current mirrors presented would represent the bit-8, bit-4, bit-2, and bit-1 values, and the third and fourth current mirror, representing the bit-2 and bit-1 current mirror, would be provided control signals and voltage matched and current mirrored. Only the third and fourth one bit current mirror cell thus operate. The result would be an Iout of 300 microamps as the sum of the output current of 200 microamps from the third one-bit current mirror plus the output current 100 microamps from the fourth one-bit current mirror.

The current design may comprise a CMOS current mirror, typically a state of the art CMOS circuit offering both low voltage and high voltage transistors, wherein the design includes external reference current, an N-bit register, and N one-bit precision current mirror cells. One CMOS circuit that may be employed comprises 0.13 u CMOS technology with 3.3V and 1.0V transistors. The N-bit register 305 may be a conventional data register known to those skilled in the art having an ability to store an N-bit digital control word. The N-bit register 305 applies the N-bit control word to select switch 308 in the corresponding one bit precision current mirror cell to connect the output line 311, also called the common line or summing line, with the Vdc power supply through mirror transistor 307. Summing may be provided by an element other than the output line 311. The net output current, lout, represents the sum of the currents passing through the selected mirror transistor cells, and is equal to:

$$I\text{out}=\Sigma(I\_\text{msb}, \ldots, I\_m, \ldots I\_\text{lsb}) \quad (1)$$

The feedback amplifier 306 and the analog control transistor 309 operate to maintain the drain voltage Vm' of mirror transistor 307 to replicate or be as precisely equivalent as possible to the mirror gate voltage Vm. In operation, when Vm' is equal to Vm, the drain current of the selected mirror transistor cell, such as $m^{th}$-bit one bit precision current mirror cell 304*m*, may closely replicate the drain current of the master mirror transistor 302 multiplied by a scale factor M.

Thus the present design includes a feedback control circuit in each one bit precision current mirror cell for the purpose of asserting the condition of Vm' equal to Vm as a precondition for a precision current mirror. The circuitry thus matches voltage and mirrors the current and matching the current when the voltages are matched. The feedback loop in the present design in this arrangement comprises the voltage of the master mirror transistor 302. The feedback loop provided tends to eliminate voltage drops associated with the mirror transistor 307.

In an advanced setting, such as an MRAM setting, write currents typically are controlled with a high degree of accuracy. In a typical MRAM setting, the values of output voltage Vout at operational output current lout are typically in the range of less than one volt. CMOS circuits can provide low voltage and high voltage transistors, and control of current within a very narrow range can be achieved.

In the present design, each one bit precision current mirror cell can employ a feedback circuit due to the advantages provided by CMOS technology. Individual cell control provides precise activation of each current source and a resultant high precision total current. High voltage and low voltage transistors in CMOS technology provides for Nchannel control and switch transistors instead of Pchannel transistors. Nchannel transistors require less area for implementation and voltage headroom required by Nchannel transistors can be provided by the high voltage CMOS circuits. In such a CMOS implementation, a wide range of output voltages for a wide range of currents can be provided, in addition to the voltage headroom required for the Nchannel transistors.

Regarding power use and consumption, the select switch 308 is provided within the feedback loop and does not consume power or operate when its one bit current source block is not selected by the control word provided by the N-bit register 305.

Thus in one embodiment of the current design, there is provided a digital current source used to mirror a reference current using a digitally controlled analog current source. The digitally controlled analog current source multiplies a current from a master mirror transistor producing an output current that is a digitally controlled multiple of the reference current. The circuit comprises a plurality of one bit current mirror cells. Each one bit current mirror cell comprises a mirror transistor receiving an analog gate voltage from a master mirror transistor and providing a drain voltage, an operational amplifier configured to maintain the drain voltage for the mirror transistor equivalent to the analog gate voltage, and a switch configured to receive one control bit, the switch enabling current mirroring when the mirror voltage is substantially equivalent to the master mirror voltage. The digital current source further includes a common line summing element employed to receive and compile currents from each of the one bit current mirror cells.

According to a second embodiment of the present design, a single bit precision current mirror cell is provided. The single bit precision current mirror cell is configured to receive a master transistor voltage and a digital control value. The single bit precision current mirror cell operates in association with an analog current source. The single bit current mirror cell includes a transistor configured to receive the master transistor voltage and provide a mirror gate voltage and a feedback amplifier configured to receive the master transistor voltage and mirror gate voltage and maintain the master transistor voltage substantially equivalent to the mirror gate voltage using feedback. The single bit precision current mirror cell further receives the digital control value and employs the feedback amplifier to provide an analog cell current output substantially mirroring a digital derivative of an analog current value provided by the analog current source. Digital derivative in this context may represent a digitized current range in accordance with operation of the N-bit register 305 discussed above.

Figure 4:
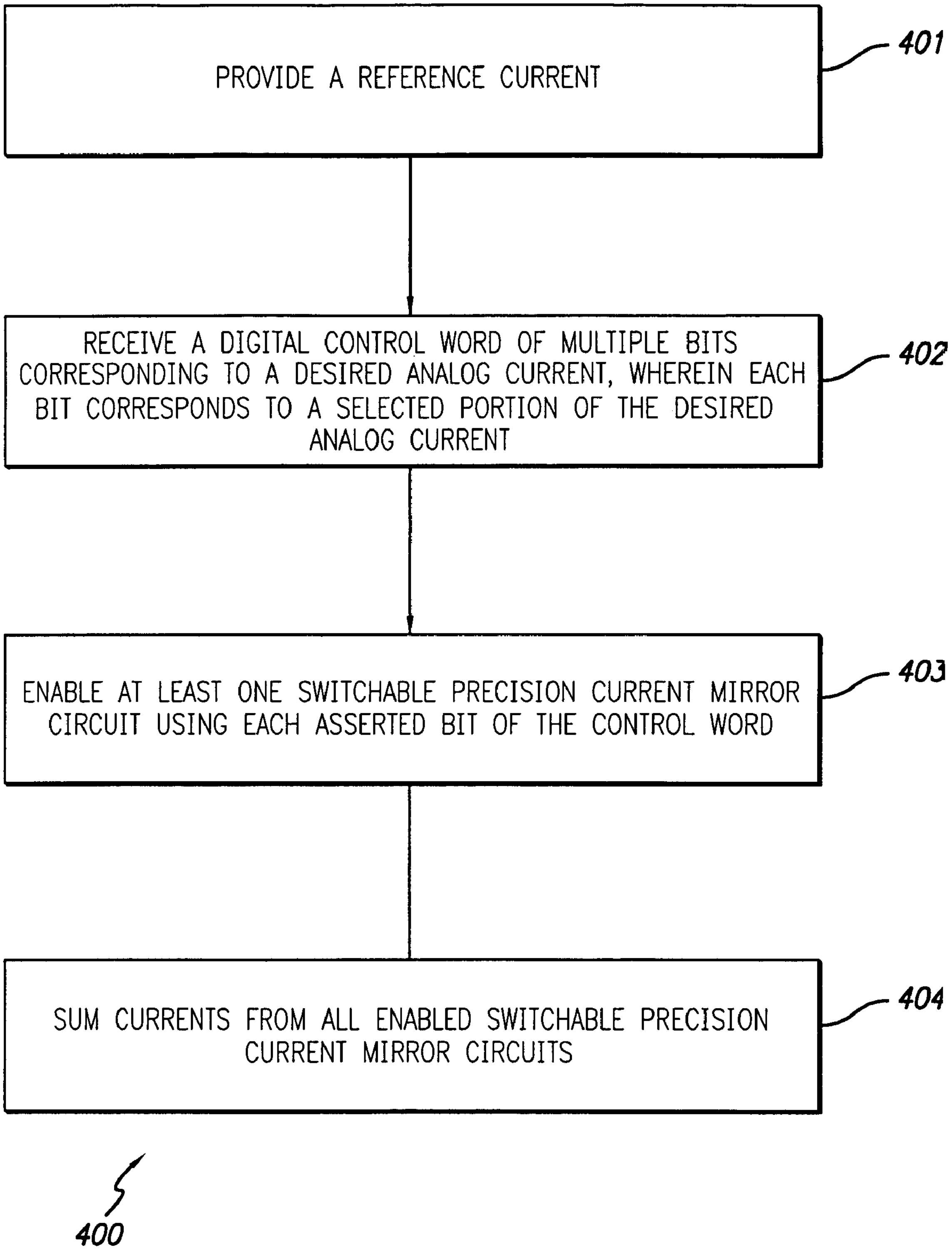
FIG. 4 is a flowchart of an alternate embodiment of the present design.

A flowchart 400 of a further embodiment of the design is provided in FIG. 4. The flowchart of FIG. 4 represents a method for mirroring an analog current value received from an analog current source. Point 401 calls for providing a reference current. Point 402 calls for receiving a digital control word of multiple bits corresponding to a desired analog current, wherein each bit corresponds to a selected portion of the desired analog current. Point 403 enables at least one switchable precision current mirror circuit associated with each asserted bit of the control word, and point 404 sums currents from all enabled switchable precision current mirror circuits.

As differentiated from previous designs, the present design affords the opportunity to mirror current by selecting only those digital components of the desired current and operating circuitry necessary to mirror the desired current rather than mirroring all current and directing excess current to ground. The present design is thus more efficient in that the present design can provide current mirroring using less current and less power than previously required.

While the aforementioned and illustrated devices and methods for mirroring current for use in advanced applications, such as MRAM applications, has been described in connection with exemplary embodiments, those skilled in the art will understand that many modifications in light of these teachings are possible, and this application is intended to cover any variation thereof. Accordingly, any and all modifications, variations, or equivalent arrangements which may occur to those skilled in the art, should be considered to be within the scope of the present invention as defined in the appended claims.

What is claimed is:

1. A current digital to analog mirror circuit used to mirror a reference current using a digitally controlled analog current source, the analog current source multiplies a current from a master mirror transistor producing an output current that is a digitally controlled multiple of the reference current, the circuit comprising:

a plurality of one bit current mirror cells, each one bit current mirror cell comprising:

a mirror transistor receiving an analog gate voltage from a master mirror transistor and providing a drain voltage;

an operational amplifier configured to maintain the drain voltage for the mirror transistor equivalent to the analog gate voltage; and a switch configured to receive one control bit, the switch enabling current mirroring when the mirror voltage is substantially equivalent to the master mirror voltage; and a common line summing element employed to receive and compile currents from each of the one bit current mirror cells.

2. The current digital to analog mirror circuit of claim 1, wherein the switch enabling current mirroring switches a digital derivative of the reference current into at least one one bit current mirror cell and uses at least one operational amplifier to mirror an analog current value substantially equivalent to the digital derivative of the reference current.

3. The current digital to analog mirror circuit of claim 2, wherein all one bit current mirror cells provide analog current values to the common line summing element, thereby producing a summed total output current.

4. The current digital to analog mirror circuit of claim 1, wherein each one bit current mirror cell corresponds to a significant bit of a range of available desired currents to be mirrored.

5. The current digital to analog mirror circuit of claim 1, wherein each control bit is provided by an N-bit register configured to generate a desired analog current level according to a digital value stored in the N-bit register.

6. The current digital to analog mirror circuit of claim 1, wherein each one bit current mirror cell further comprises an analog control transistor configured to receive a signal from the operational amplifier of the one bit current mirror cell and provide output current to the common line summing element.

7. The current digital to analog mirror circuit of claim 1, wherein each one bit current mirror cell is binary weighted.

8. The current digital to analog mirror circuit of claim 1, wherein each one bit current mirror cell is linearly weighted.

9. The current digital to analog mirror circuit of claim 5, wherein control of the output current is established by a relative sizing of mirror transistors of the one bit current mirror cells to the master mirror transistor and the digital value stored in the N-bit register.

10. A single bit precision current mirror cell configured to receive a master mirror transistor drain voltage from a master mirror transistor and a digital control value, comprising:

a mirror transistor configured to receive the master mirror transistor drain voltage and provide a mirror gate voltage; and an operational amplifier configured to receive the master transistor voltage and mirror gate voltage and maintain the master mirror transistor drain voltage substantially equivalent to the mirror gate voltage using feedback;

wherein the single bit precision current mirror cell receives the digital control value and employs the operational amplifier to provide an analog cell current output substantially mirroring a digital derivative of a reference current value.

11. The single bit precision current mirror cell of claim 10 wherein the analog cell current output is provided to an output current summing line.

12. The single bit precision current mirror cell of claim 10, further comprising an analog control transistor configured to receive a signal from the operational amplifier of the one bit current mirror cell and provide output current to an output current summing line.

13. The single bit precision current mirror cell of claim 10, wherein the digital control value is provided by an N-bit register containing a digital control word corresponding to a current value desired to be generated.

14. The single bit precision current mirror cell of claim 10, wherein the single bit precision current mirror cell generates an output current to the output current summing line proportional to both current in the master mirror transistor and relative sizing of the mirror transistor to the master mirror transistor when the mirror transistor is in a conducting state.

15. The single bit precision current mirror cell of claim 10, wherein a conducting state of the mirror transistor is determined by a digital value stored in the N-bit register.

16. The single bit precision current mirror cell of claim 10, wherein the single bit precision current mirror corresponds to one bit from a range of bit values digitally representing an expected current range.

17. The single bit precision current mirror cell of claim 10, wherein the operational amplifier only operates to control voltage and mirror current when a digital control value is received.

18. The single bit precision current mirror cell of claim 11, wherein the output current summing line also receives output voltage from the single bit precision current mirror cell.

19. A method for digitally generating an analog current, comprising:

providing a reference current;

receiving a digital control word of multiple bits corresponding to a desired analog current, wherein each bit corresponds to a selected portion of the desired analog current;

enabling at least one switchable precision current mirror circuit associated with each asserted bit of the control word; and summing currents from all enabled switchable precision current mirror circuits;

wherein enabling at least one switchable precision current mirror comprises switching a switch associated with an optional amplifier to a conducting state when a bit of the control word selects the switch, thereby supplying voltage and current to the operational amplifier and to a non-conducting state when not selected.

20. The method of claim 19, further comprising subsequently switching off the analog current value using a digital control transistor operating in feedback.

21. The method of claim 19, wherein the desired analog current represents drain current of a mirror transistor multiplied by a scale factor.

22. The method of claim 19, wherein the method operates to decrease impedance in at least one switch and voltage drops across at least one transistor when selected by a digital control signal.

23. A digitally-controlled current source, comprising:

a reference voltage generator having a reference current source therein;

an output current line; and a plurality of current mirror cells electrically coupled to an output of said reference voltage generator and said output current line, said plurality of current mirror cells respectively comprising:

a mirror transistor having a gate terminal responsive to a voltage received from the output of said reference voltage generator;

an amplifier having a first input responsive to the voltage received from the output of said reference voltage generator and a second input electrically coupled to a drain terminal of said mirror transistor; and first and second transistors electrically connected in series between the drain terminal of said mirror transistor and said output current line, said first transistor having a gate terminal responsive to a bit of a digital control word and said second transistor having a gate terminal connected to an output of said amplifier.

24. A digitally-controlled current source, comprising:

a reference voltage generator comprising a reference current source and a master mirror transistor electrically connected in series, said master mirror transistor having gate and drain terminals electrically connected together;

an output current line; and a plurality of current mirror cells electrically coupled to the gate terminal of the master mirror transistor and said output current line, said plurality of current mirror cells respectively comprising:

a cell mirror transistor having a gate terminal electrically coupled to the gate terminal of the master mirror transistor;

an operational amplifier having a first input electrically coupled to the gate terminal of said cell mirror transistor and a second input electrically coupled to a drain terminal of said cell mirror transistor; and first and second transistors electrically connected in series between the drain terminal of said cell mirror transistor and said output current line, said first transistor having a gate terminal responsive to a bit of a digital control word and said second transistor having a gate terminal connected to an output of said operational amplifier.

* * * * *